US009853062B2

(12) United States Patent
Tezuka et al.

(10) Patent No.: US 9,853,062 B2
(45) Date of Patent: *Dec. 26, 2017

(54) DISPLAY PANEL AND DISPLAY APPARATUS

(71) Applicant: Sakai Display Products Corporation, Sakai-shi, Osaka (JP)

(72) Inventors: Tatsuya Tezuka, Sakai (JP); Hidetoshi Nakagawa, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 48 days.

This patent is subject to a terminal disclaimer.

(21) Appl. No.: 14/905,488

(22) PCT Filed: Jul. 10, 2014

(86) PCT No.: PCT/JP2014/068495
§ 371 (c)(1),
(2) Date: Jan. 15, 2016

(87) PCT Pub. No.: WO2015/008697
PCT Pub. Date: Jan. 22, 2015

(65) Prior Publication Data
US 2016/0155754 A1 Jun. 2, 2016

(30) Foreign Application Priority Data
Jul. 19, 2013 (JP) ................................. 2013-150774

(51) Int. Cl.
*H01L 27/12* (2006.01)
*G02F 1/13* (2006.01)
(Continued)

(52) U.S. Cl.
CPC .......... *H01L 27/124* (2013.01); *G02F 1/1309* (2013.01); *G02F 1/1345* (2013.01); *G02F 2001/136263* (2013.01)

(58) Field of Classification Search
CPC . H01L 27/124; H01L 23/48; H01L 23/49572; H01L 2224/50; H01L 2224/79;
(Continued)

(56) References Cited

U.S. PATENT DOCUMENTS 5,757,450 A   5/1998  Fujii et al.
6,380,992 B1  4/2002  Lee
(Continued)

FOREIGN PATENT DOCUMENTS

JP    H8-76136 A    3/1996
JP    H10-319438 A  12/1998
(Continued)

OTHER PUBLICATIONS

English translation of KR 20040108075 A, Title: Liquid Crystal Display Device And Fabricating Methodthereof, Author: Cheol-Sang Shin; Hyeon-Tae Kim; Date of publication: Dec. 23, 2004.*
(Continued)

*Primary Examiner* — Edward Glick
*Assistant Examiner* — Shan Liu
(74) *Attorney, Agent, or Firm* — Ruby J. Ng; Bret E. Field; Bozicevic, Field & Francis LLP

(57) ABSTRACT

A display panel includes a plurality of display elements disposed in a matrix manner, signal input parts to which signals to be supplied to the plurality of display elements are input, and a plurality of signal wirings which connect the plurality of display elements and the signal input parts, wherein the signal wirings includes a lead-out wiring part in which a wiring interval nearer the signal input parts and a wiring interval nearer the display elements are different from each other, and at least a part of the signal wirings in the lead-out wiring part is provided with a plurality of meander wiring parts whose wirings are meandered, wherein the signal wirings include a meander wiring part nearer the
(Continued)

signal input parts, and at least one meander wiring part having a larger amplitude of the meander wiring than the meander wiring part nearer the signal input parts, and the amplitude of the meander wiring in the at least one meander wiring part is determined by matching with a wide wiring interval in the lead-out wiring part.

8 Claims, 12 Drawing Sheets

(51) Int. Cl.
G02F 1/1345 (2006.01)
G02F 1/1362 (2006.01)

(58) Field of Classification Search
CPC ....... H01L 2224/86; H01L 2225/06579; H01L 2225/107; H01L 24/50; G02F 1/1309; G02F 1/1345; G02F 2001/136263; G02F 1/0121; G02F 1/0327; G02F 1/076; G02F 1/133; G02F 1/13306; G02F 1/13452; G02F 1/13454; G02F 1/13458; G02F 2001/133388; G02F 2001/133612; G02F 2001/13456; G09G 2300/0426; G09G 2300/0408; G09G 3/3655; G09G 3/3674; G09G 3/3685; G09G 2290/00; G09G 2320/0223; G09G 2300/0421; G09G 3/36
USPC .................................. 349/149–152
See application file for complete search history.

(56) References Cited

U.S. PATENT DOCUMENTS

| | | |
|---|---|---|
| 6,856,374 B1 | 2/2005 | Ozaki et al. |
| 7,705,952 B2 | 4/2010 | Lee et al. |
| 8,432,506 B2 | 4/2013 | Qian |
| 8,467,027 B2 | 6/2013 | Chang et al. |
| 8,848,127 B2 | 9/2014 | Qin et al. |
| 2003/0179158 A1 | 9/2003 | Sakaki |
| 2006/0124966 A1 | 6/2006 | Oh et al. |
| 2007/0080433 A1* | 4/2007 | Lai ........................ G02F 1/1345 257/666 |
| 2007/0216845 A1* | 9/2007 | Liao ................... G02F 1/136286 349/149 |
| 2008/0129944 A1* | 6/2008 | Park ...................... G02F 1/1345 349/150 |
| 2008/0143944 A1 | 6/2008 | Chang et al. |
| 2008/0158127 A1 | 7/2008 | Chang et al. |
| 2009/0153764 A1 | 6/2009 | Hsu et al. |
| 2010/0225624 A1* | 9/2010 | Fu ............................ G09G 3/20 345/205 |
| 2010/0283955 A1* | 11/2010 | Kim ...................... G02F 1/1345 349/149 |
| 2011/0075089 A1* | 3/2011 | Jheng .................... G02F 1/1345 349/152 |
| 2011/0116215 A1* | 5/2011 | Chang .................. G02F 1/1339 361/679.01 |
| 2013/0027624 A1 | 1/2013 | Zhuang et al. |
| 2013/0242511 A1 | 9/2013 | Ohishi |
| 2014/0009714 A1* | 1/2014 | Shim ..................... G02F 1/1333 349/43 |
| 2015/0009438 A1* | 1/2015 | Du ........................ G02F 1/1345 349/42 |
| 2015/0108480 A1 | 4/2015 | Xu et al. |
| 2016/0161814 A1* | 6/2016 | Nakagawa ............ G02F 1/1309 345/87 |

FOREIGN PATENT DOCUMENTS

| | | | |
|---|---|---|---|
| JP | 2003-005670 | | 1/2003 |
| KR | 20040108075 A | * | 12/2004 |
| KR | 10-0963414 B1 | | 6/2010 |

OTHER PUBLICATIONS

Office Action for U.S. Appl. No. 14/904,881 dated Feb. 7, 2017, 10 pages.
Final Office Action for U.S. Appl. No. 14/904,881 dated Jul. 19, 2017, 12 pages.

* cited by examiner

DISPLAY PANEL AND DISPLAY APPARATUS

CROSS-REFERENCE TO RELATED APPLICATIONS

This application is the national phase of PCT International Application No. PCT/JP2014/068495 which has an International filing date of Jul. 10, 2014 and designated the United States of America.

FIELD

The present application relates to a display panel and a display apparatus which achieve narrowing of a frame.

BACKGROUND

A liquid crystal display apparatus has been widely used for a computer display, a television receiving apparatus, an information display for displaying various information and the like. For example, an active matrix type liquid crystal display apparatus is configured to serve thin film transistors (TFTs) installed in each pixel as a switching element to apply a signal voltage (gradation voltage) to a pixel electrode within a period in which the switching element is turned on so as to control light transmittance in each pixel, thereby implementing a multi-gradation display with high definition without a crosstalk between the pixels.

Generally, a liquid crystal display panel included in the liquid crystal display apparatus includes two transparent substrates made of a glass thin plate and a liquid crystal sealed between these substrates. One substrate (TFT glass substrate) is provided with the pixel electrode, the TFT, and the like in each pixel, and the other substrate (CF glass substrate) is provided with a color filter facing the pixel electrode and common electrodes (counter electrodes) which are common to each pixel.

The TFT glass substrate is provided with a plurality of gate wirings extending in a horizontal direction, and a plurality of source wirings extending in a vertical direction. Rectangular regions which are partitioned by these gate wirings and source wirings are a pixel region, respectively. Each pixel region is provided with the TFT which is a switching element and the pixel electrode. Further, the liquid crystal display panel includes a gate driver connected to the gate wiring and a source driver connected to the source wiring to control an image display in each pixel.

The source driver outputs display data to each source wiring at a timing synchronized with a data clock signal, within one horizontal synchronizing period. Meanwhile, the gate driver sequentially outputs scanning signals to the gate wirings at a timing synchronized with a gate clock signal, within one vertical synchronizing period. The TFT of the pixel connected to the gate wiring to which the scanning signal is supplied is turned on, and the display data supplied to the source wiring is written in the pixel electrode. Thereby, an orientation of liquid crystal molecules within the pixel is changed, and thus the light transmittance of the pixel is changed. The display data are respectively written in each pixel within one vertical synchronizing period, and a desired image is displayed on the liquid crystal display panel.

SUMMARY

Various display panels including the liquid crystal display panel as described above have a plurality of signal wirings disposed therein to transmit a display signal to be supplied to a display element, and a control signal for driving the display element.

In addition, the display panel is provided with a plurality of signal input parts to which the display signal and the control signal are input on a peripheral edge portion thereof, and is configured to supply the display signal and the control signal input to the signal input parts to each signal wiring through lead-out wirings which connect the signal input parts and the signal wirings.

When connecting the plurality of signal wirings to signal input parts through the lead-out wirings, a wiring length of the lead-out wiring connected to the signal wiring in close vicinity to the signal input parts is decreased, whereas the wiring length of the lead-out wiring connected to the signal wiring separated from the signal input parts is increased, such that unevenness in a resistance value between the lead-out wirings connected to the signal wirings occurs. As a result, even when supplying display signals or control signals having the same magnitude as each other from the signal input parts, the magnitudes of the signals supplied to the display elements are different from each other depending on the wiring length of the lead-out wirings to be transmitted, and become a factor in terms of an occurrence of luminance unevenness or the like.

Conventionally, in order to suppress the unevenness in a resistance value between the lead-out wirings, a method for widening a line width of the lead-out wiring having an increased wiring length than the line width of the lead-out wiring having a decreased wiring length has been employed (see Japanese Patent Laid-open No. 8-76136).

However, in a recent liquid crystal display apparatus, further narrowing of a frame is required. In the liquid crystal display apparatus with a narrow frame, since a peripheral portion of the panel is narrowed, a space in which the lead-out wirings are disposed becomes smaller. The conventional method for widening the wiring width has problems that, it is necessary to avoid a contact between the lead-out wirings adjacent to each other, such that, in the liquid crystal display apparatus with a narrow frame, a sufficient wiring width may not be secured, and the unevenness in the resistance value between the lead-out wirings may not be solved.

In consideration of the above-mentioned circumstances, it is an object of the present application to provide a display panel and a display apparatus which are capable of suppressing unevenness in a resistance value between lead-out wirings even in the display panel with a narrow frame.

A display panel according to the present application includes a plurality of display elements disposed in a matrix manner, signal input parts to which signals to be supplied to the plurality of display elements are input, and a plurality of signal wirings which connect the plurality of display elements and the signal input parts, wherein the signal wirings includes a lead-out wiring part in which a wiring interval nearer the signal input parts and a wiring interval nearer the display elements are different from each other, and at least a part of the signal wirings in the lead-out wiring part is provided with a plurality of meander wiring parts whose wirings are meandered, wherein the signal wirings include a meander wiring part nearer the signal input parts, and at least one meander wiring part having a larger amplitude of the meander wiring than the meander wiring part nearer the signal input parts, and the amplitude of the meander wiring in the at least one meander wiring part is determined by matching with a wide wiring interval in the lead-out wiring part.

The display panel according to the present application is characterized in that a pitch of the meander wiring in the meander wiring part nearer the signal input part is wider than the pitch of the meander wiring in the at least one meander wiring part.

The display panel according to the present application is characterized in that the meander wiring part is provided so that a difference in a resistance value between the plurality of signal wirings becomes a value within a predetermined range.

The display panel according to the present application is characterized by including a repair wiring which is disposed so as to intersect the signal wiring in the meander wiring part at at least two locations, and an insulation layer which is provided between the signal wiring and the repair wiring.

A display apparatus according to the present application includes the display panel described above and a driving unit configured to drive the plurality of display elements included in the display panel.

According to the present application, the meander wiring part is provided by dividing it into the meander wiring part nearer the signal input part and the meander wiring part at a subsequent stage thereof, such that it is possible to dispose the subsequent-stage meander wiring part in a relatively wide region. As a result, it is easy to adjust the meandering amount in the subsequent-stage meander wiring part, and even in the liquid crystal display panel with a narrow frame, a difference in the resistance value between the lead-out wirings may enter within a predetermined range.

Further, according to the present application, the repair wiring intersecting the wiring of the meander wiring part to be repaired at at least two locations is provided, such that the cross part between the wiring to be repaired and the repair wiring may be easily viewed, and a repair efficiency may be improved.

The above and further objects and features of the invention will more fully be apparent from the following detailed description with accompanying drawings.

DESCRIPTION OF EMBODIMENTS

Hereinafter, the present application will be described in detail with reference to the accompanying drawings illustrating the embodiments thereof.

Embodiment 1.

Figure 1:
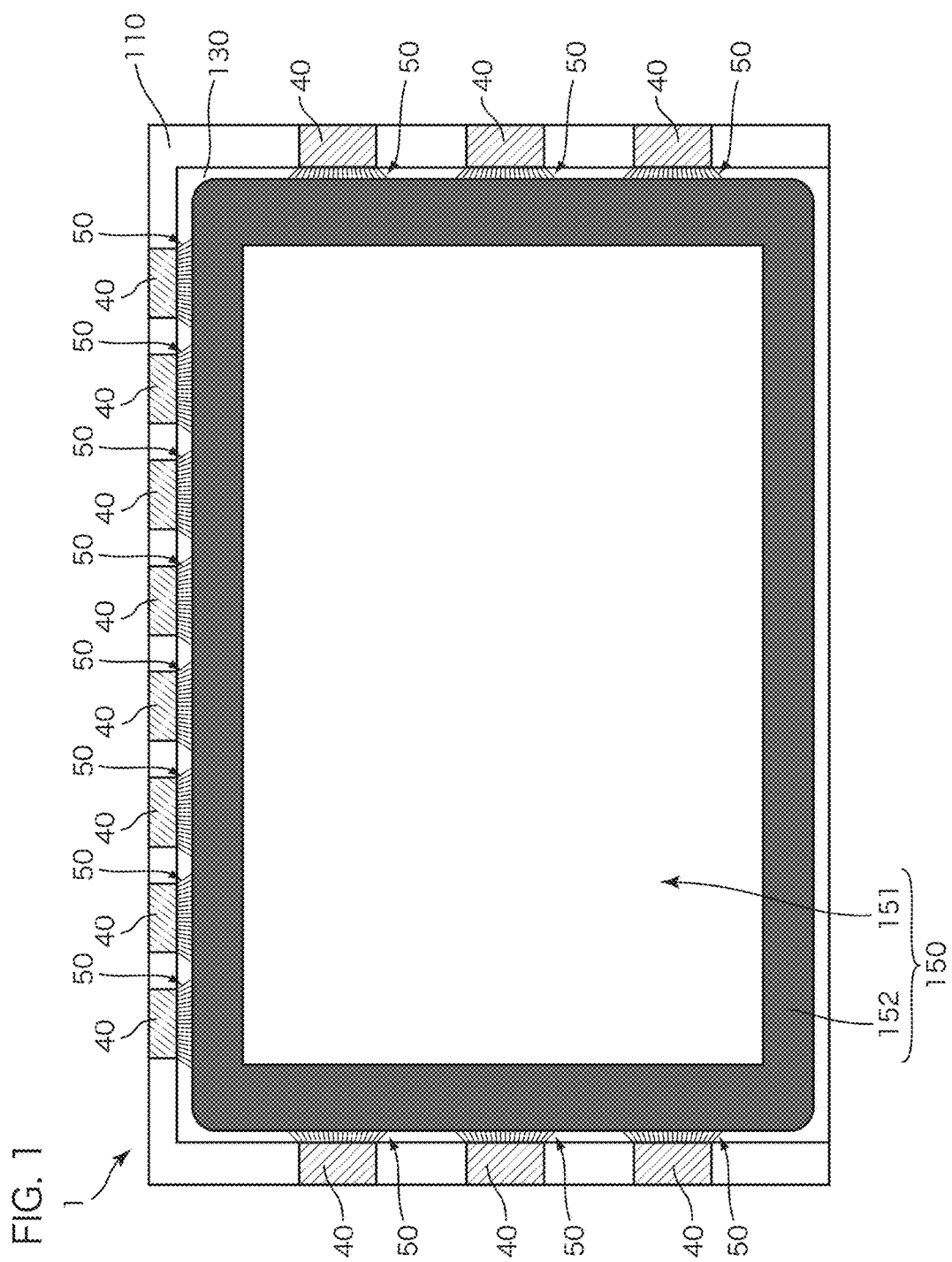
FIG. 1 is a schematic view of a liquid crystal display panel according to an embodiment of the present embodiment.

FIG. 1 is a schematic view of a liquid crystal display panel according to the present embodiment. A liquid crystal display panel 1 according to the present embodiment includes a thin film transistor (TFT) side glass substrate 110, a liquid crystal layer 120 (see FIG. 10), and a color filter (CF) side glass substrate 130.

The TFT side glass substrate 110 is a transparent rectangular substrate, and has a slightly broader cross-section than that of the CF side glass substrate 130. The TFT side glass substrate 110 includes pixel electrodes and TFTs which are formed on one surface thereof corresponding to each of a plurality of display pixels disposed in a matrix manner, for example. In addition, the TFT side glass substrate 110 is provided with signal input parts 40, 40, and . . . on a peripheral edge portion thereof, to which display signals (or scanning signals) to be supplied to each display pixel are input. Also, the TFT side glass substrate 110 is provided with a wiring layer including signal wirings such as gate wirings 21, and source wirings 31 (see FIG. 2).

The display signals to be supplied to each of the display pixels, for example, are input to the signal input parts 40, 40, and . . . arranged along an upper side of the liquid crystal display panel 1. Each of the signal input parts 40 is provided with a lead-out wiring part 50, and the display signals are supplied to the appropriate number (for example, 720) of the source wirings 31 through the lead-out wiring parts 50.

Similarly, the scanning signals for selecting the display pixels to be supplied with the display signals are input to the signal input parts 40, 40, and . . . , which are arranged along a left side or a right side of the liquid crystal display panel 1. Each of the signal input parts 40 is provided with the lead-out wiring part 50, and the scanning signals are supplied to the appropriate number (for example, 360) of the gate wirings 21 through the lead-out wiring parts 50.

The CF side glass substrate 130 is a transparent rectangular substrate, and is provided to face one surface of the TFT side glass substrate 110. The CF side glass substrate 130 is provided with counter electrodes 131 on a surface thereof facing the TFT side glass substrate 110 (see FIG. 10), and is additionally provided with a black matrix 151 for dividing a display region into a lattice-shaped pattern corresponding to each of the display pixels, and a frame part 152 for shielding light in a region around the display region.

The TFT side glass substrate 110 and the CF side glass substrate 130 are bonded to each other by a seal material (not illustrated) while being provided with a gap between both substrates, and by sealing a liquid crystal material into the gap, the liquid crystal layer 120 is formed.

Figure 2:
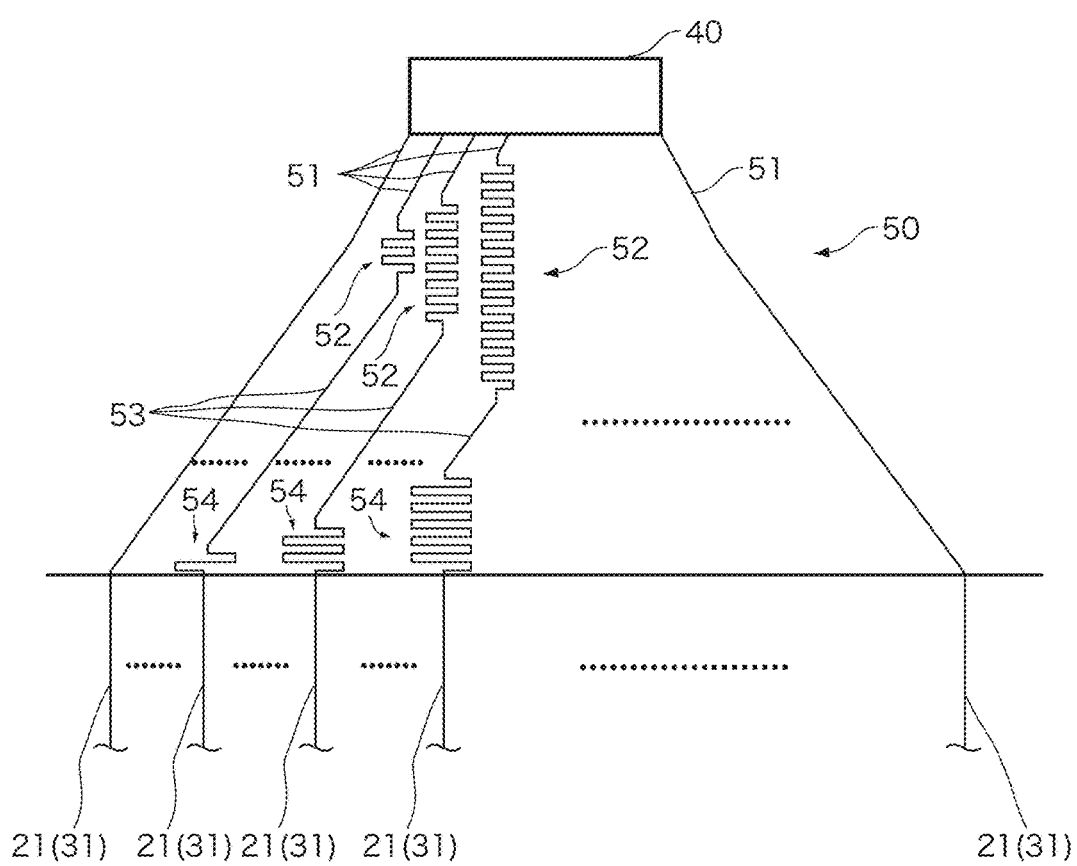
FIG. 2 is a schematic view describing a configuration of a lead-out wiring part.

FIG. 2 is a schematic view describing a configuration of the lead-out wiring part 50. FIG. 2 illustrates only a part of the lead-out wirings, for simplification. In the lead-out wiring part 50, the wirings are lead out from a narrow region on the signal input part 40 side to a wide region on the display region side. Therefore, in the vicinity of a center of the lead-out wiring part 50, a direct distance from the signal input part 40 to the signal wirings (the gate wirings 21 or the source wirings 31) is relatively short, and in the vicinity of end portions of the lead-out wiring part 50, the direct distance from the signal input part 40 to the signal wirings is relatively long. Such characteristics are more apparent, with greater narrowing of the frame.

When forming the lead-out wiring in a straight line having the same line width, the resistance value of the lead-out wiring is decreased in the vicinity of the center, and is increased in the vicinity of the end portions. As a result, even when the display signals or scanning signals having the same magnitude are supplied from the signal input parts 40, the magnitudes of signals supplied to respective signal wirings are different from each other depending on wiring lengths of the lead-out wirings to be transmitted. When displaying an image in the display region based on such the signals, a luminance unevenness appears in the displayed image.

Therefore, in the present embodiment, a part of the lead-out wirings is provided with meander wiring parts 52 and 54 whose wirings are meandered, so that a difference in the resistance value between the lead-out wirings becomes within a predetermined range (for example, 10Ω or less). That is, it is configured that the wiring length is lengthened in the vicinity of the center of the lead-out wiring part 50 by increasing the meandering amount in the meander wiring parts 52 and 54, and the wiring length is adjusted by decreasing the meandering amount from the vicinity of the center toward the end portions to make the wiring lengths of the respective lead-out wirings substantially the same as each other, such that a difference in the resistance values between the lead-out wirings enters within the predetermined range.

In the present embodiment, the prior-stage meander wiring part 52 is provided nearer to the signal input part 40, and is connected to the signal input part 40 through straight lines 51. In addition, the subsequent-stage meander wiring part 54 is provided nearer to the display region, and one end side of the meander wiring part 54 is connected to the prior-stage meander wiring part 52 through straight lines 53, and the other end side thereof is connected to the signal wirings (the gate wirings 21 or the source wirings 31) disposed within the display region.

As illustrated in FIG. 2, the meander wiring part is provided in the lead-out wiring part 50 by dividing it into the prior-stage meander wiring part 52 and the subsequent-stage meander wiring part 54, such that the subsequent-stage meander wiring part 54 may be disposed in a relatively wide region. As a result, it is easy to adjust the meandering amount in the subsequent-stage meander wiring part 54, and even in the liquid crystal display panel 1 with a narrow frame, a difference in the resistance value between the lead-out wirings may enter within a predetermined range.

Figure 3:
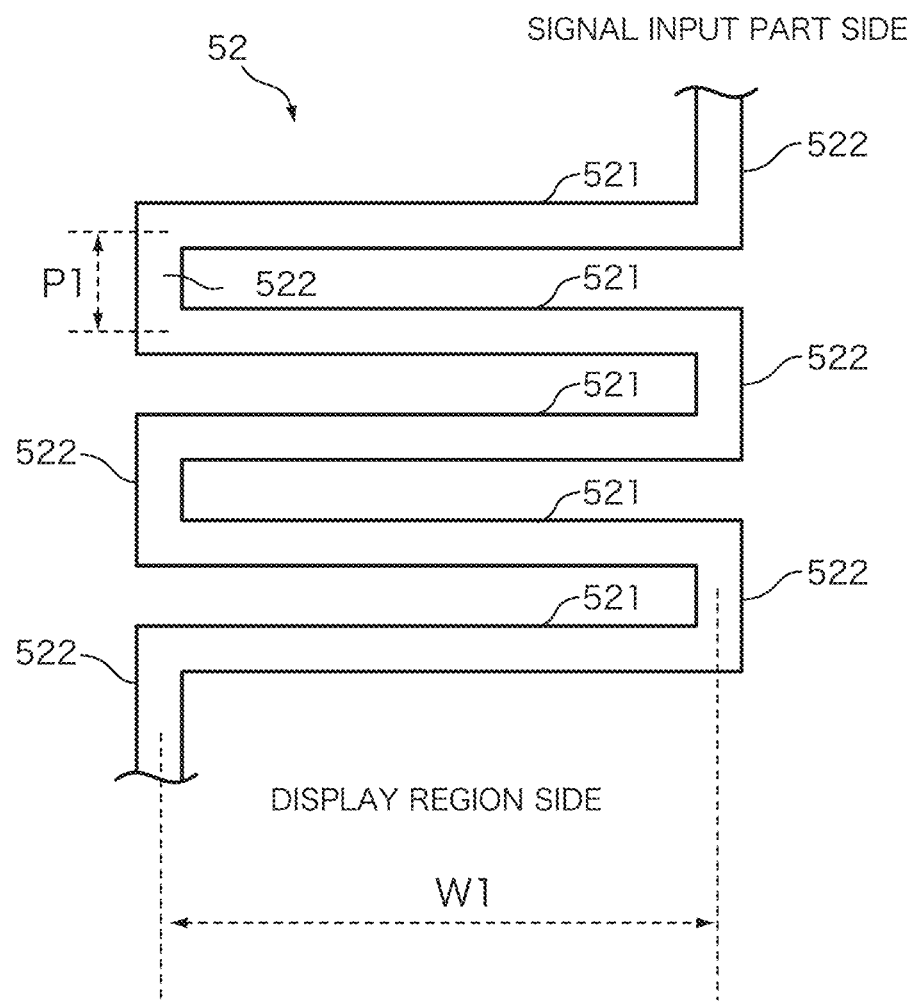
FIG. 3 is a schematic view illustrating an example of a prior-stage meander wiring part.
Figure 4:
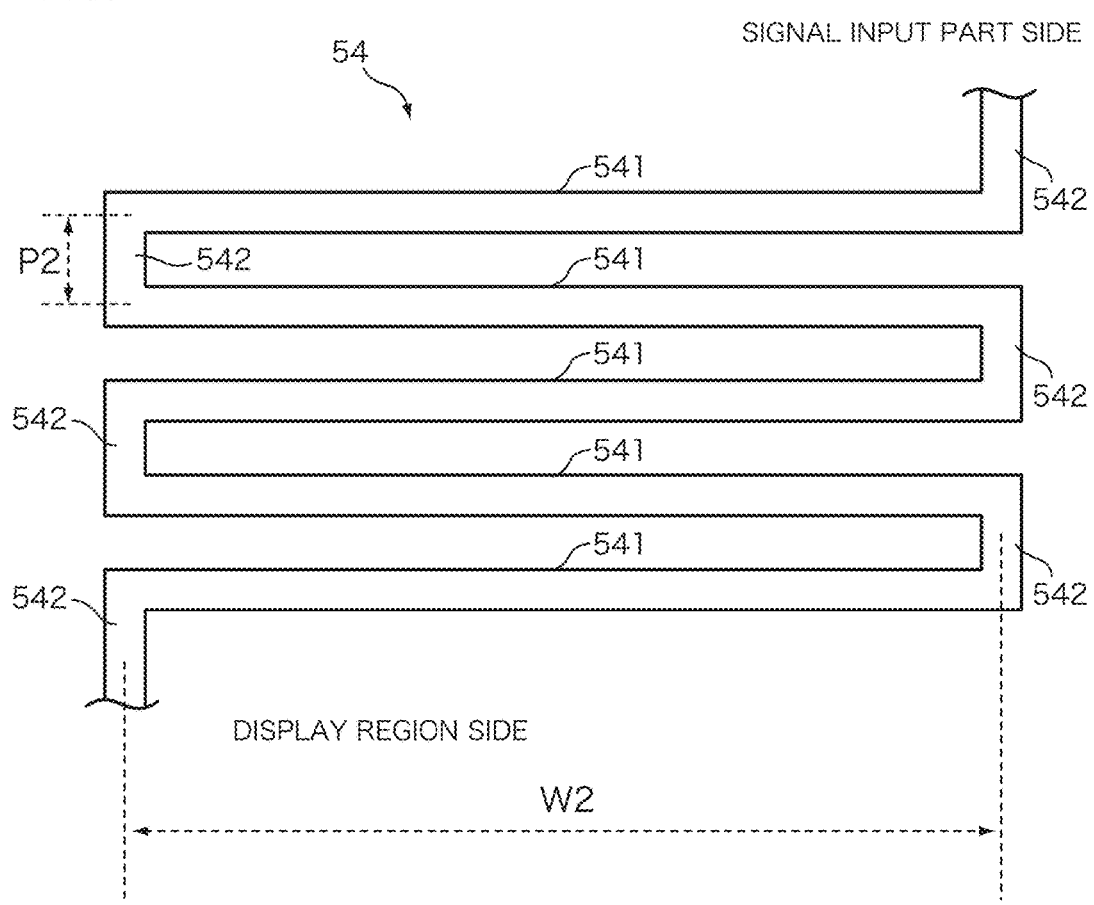
FIG. 4 is a schematic view illustrating an example of a subsequent-stage meander wiring part.

FIG. 3 is a schematic view illustrating an example of the prior-stage meander wiring part 52, and FIG. 4 is a schematic view illustrating an example of the subsequent-stage meander wiring part 54. The prior-stage meander wiring part 52 is connected to the signal input part 40 through the straight line 51. The meander wiring part 52 has, for example, cross wirings 521 provided in a direction intersecting the gate wiring 21 (or the source wiring 31), and parallel wirings 522 provided in a direction substantially parallel to the gate wiring 21 (or the source wiring 31). The meander wiring part 52 is formed by alternately connecting these cross wirings 521 and parallel wirings 522 with each other.

Also, the configuration of the subsequent-stage meander wiring part 54 is exactly the same as that of the prior-stage meander wiring part. That is, the meander wiring part 54 has, for example, cross wirings 541 provided in a direction intersecting the gate wiring 21 (or the source wiring 31), and parallel wirings 542 provided in a direction substantially parallel to the gate wiring 21 (or the source wiring 31), and is formed by alternately connecting these cross wirings 541 and parallel wirings 542 with each other.

Furthermore, in the present embodiment, it is configured that the meander wiring part 52 (54) has the cross wirings 521 (541) interesting the gate wiring 21 (or the source wiring 31), and the parallel wirings 522 (542) substantially parallel to the gate wiring 21 (or the source wiring 31), respectively, but a shape of the wiring in the meander wiring part 52 (54) is not limited to the configuration illustrated in FIG. 3. For example, it is not necessary for the cross wirings 521 (541) and the parallel wirings 522 (542) to be orthogonal to each other, and it may be configured to be connected with each other at a prescribed angle. In addition, as illustrated in FIG. 3, it is not necessary to combine the linear wirings, and for example, the meandering wiring may be formed by a combination of the cross wirings 521 (541) and bent wirings having any curvature.

Hereinafter, the wiring length of the cross wiring 521 in the prior-stage meander wiring part 52 is set to be an amplitude W1 of the meander wiring, and the wiring length of the parallel wiring 522 is set to a pitch P1 of the meander wiring. In addition, the wiring length of the cross wiring 541 in the subsequent-stage meander wiring part 54 is set to be an amplitude W2 of the meander wiring, and the wiring length of the parallel wiring 542 is set to a pitch P2 of the meander wiring.

Embodiment 1 has one characteristic in which the amplitude W2 of the meander wiring in the subsequent-stage meander wiring part 54 is matched with an interval of the lead-out wirings on the wide side, and thereby is larger than the amplitude W1 in the prior-stage meander wiring part 52.

Figure 5:
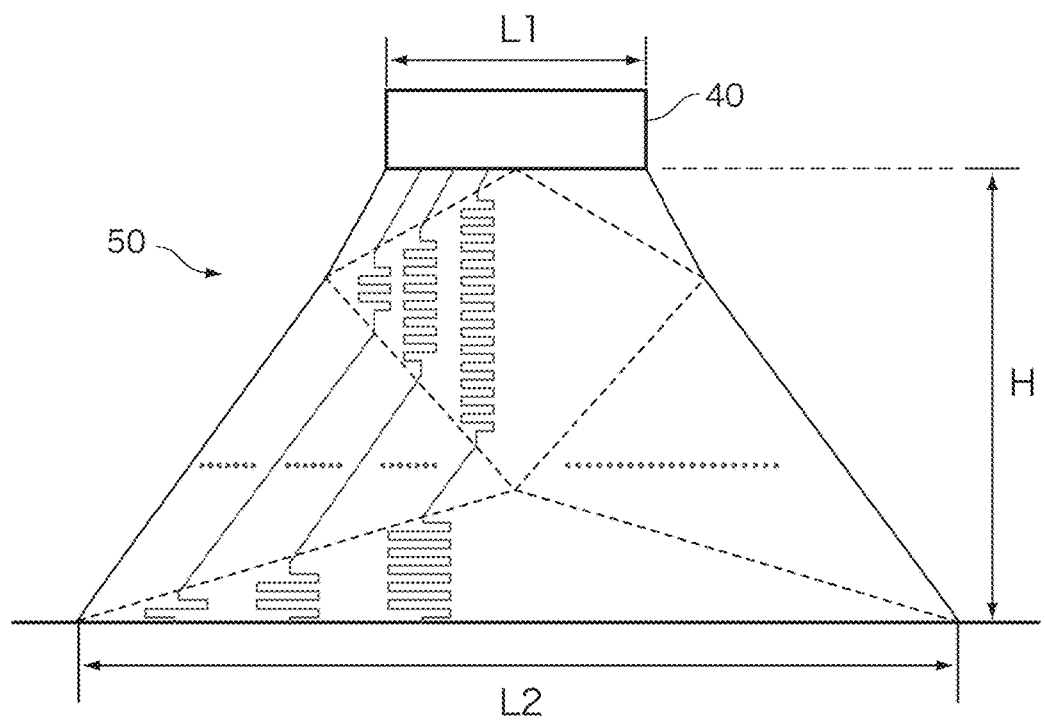
FIG. 5 is a schematic view illustrating a layout of the lead-out wiring in Embodiment 1.
Figure 6:
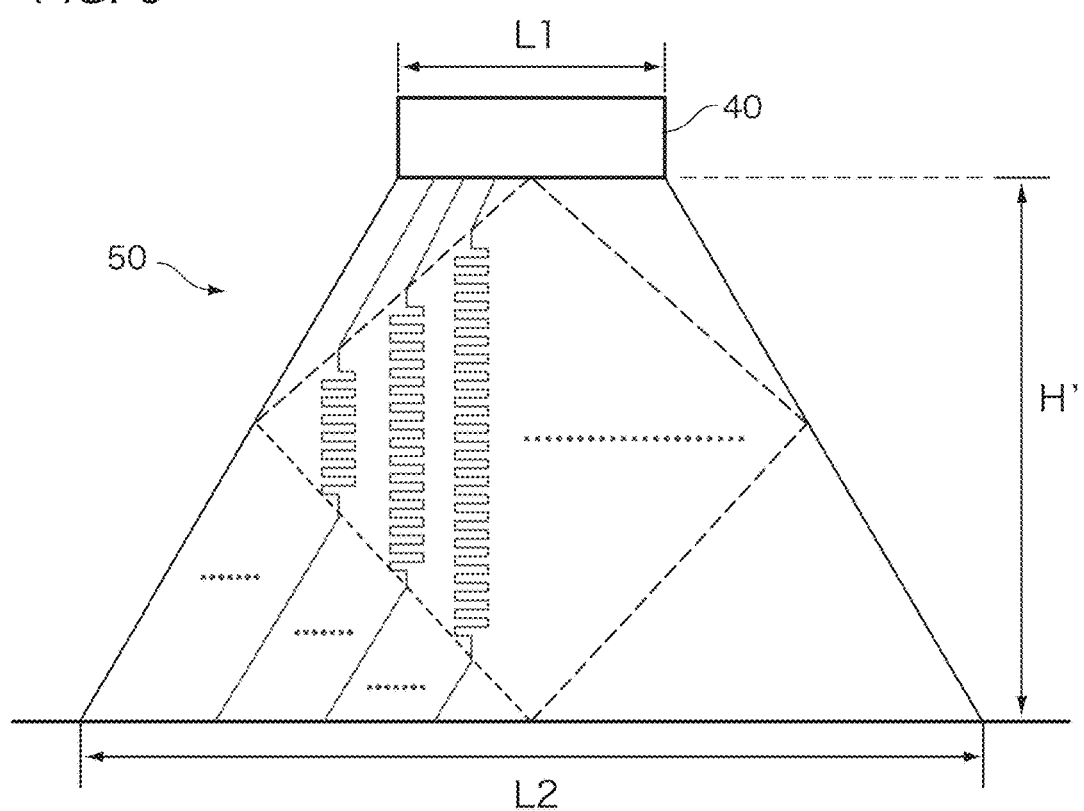
FIG. 6 is a schematic view illustrating a layout of the lead-out wiring in a reference example.

FIG. 5 is a schematic view illustrating a layout of the lead-out wiring part 50 in Embodiment 1, and FIG. 6 is a schematic view illustrating a layout of the lead-out wiring part 50 in a reference example. The layout illustrated in FIGS. 5 and 6 depicts a state in which 720 lead-out wirings extend from the signal input part 40 having a terminal width L1 (=35.2 mm), and the respective lead-out wirings are connected to 720 source wirings 31, 31, . . . which are disposed within a region having a width L2 (=110.7 mm). In Embodiment 1, the amplitude W2 of the meander wiring in the subsequent-stage meander wiring part 54 is matched with the interval of the lead-out wirings on the wide side, and thereby is larger than the amplitude W1 of the meander wiring in the prior-stage meander wiring part 52. Therefore, in particular, the wiring length at the subsequent-stage meander wiring part 54 is lengthened, and thereby a distance H from the signal input part 40 to the display region may be shortened. In the layout illustrated in FIG. 5, it is possible to achieve narrowing of a frame with a distance H of 3.96 mm.

Compared to this, in the layout of the reference example, there is a need to decrease the amplitude of the meander wiring in the meander wiring part by matching with the narrow pitch on the signal input part 40 side, such that a distance H' from the signal input part 40 to the display region is increased, and thereby lengthening of the wiring length is required. In the layout illustrated in FIG. 6, for example, the distance H' is 4.40 mm, and a frame portion is wider than that of the present application.

Figure 7:
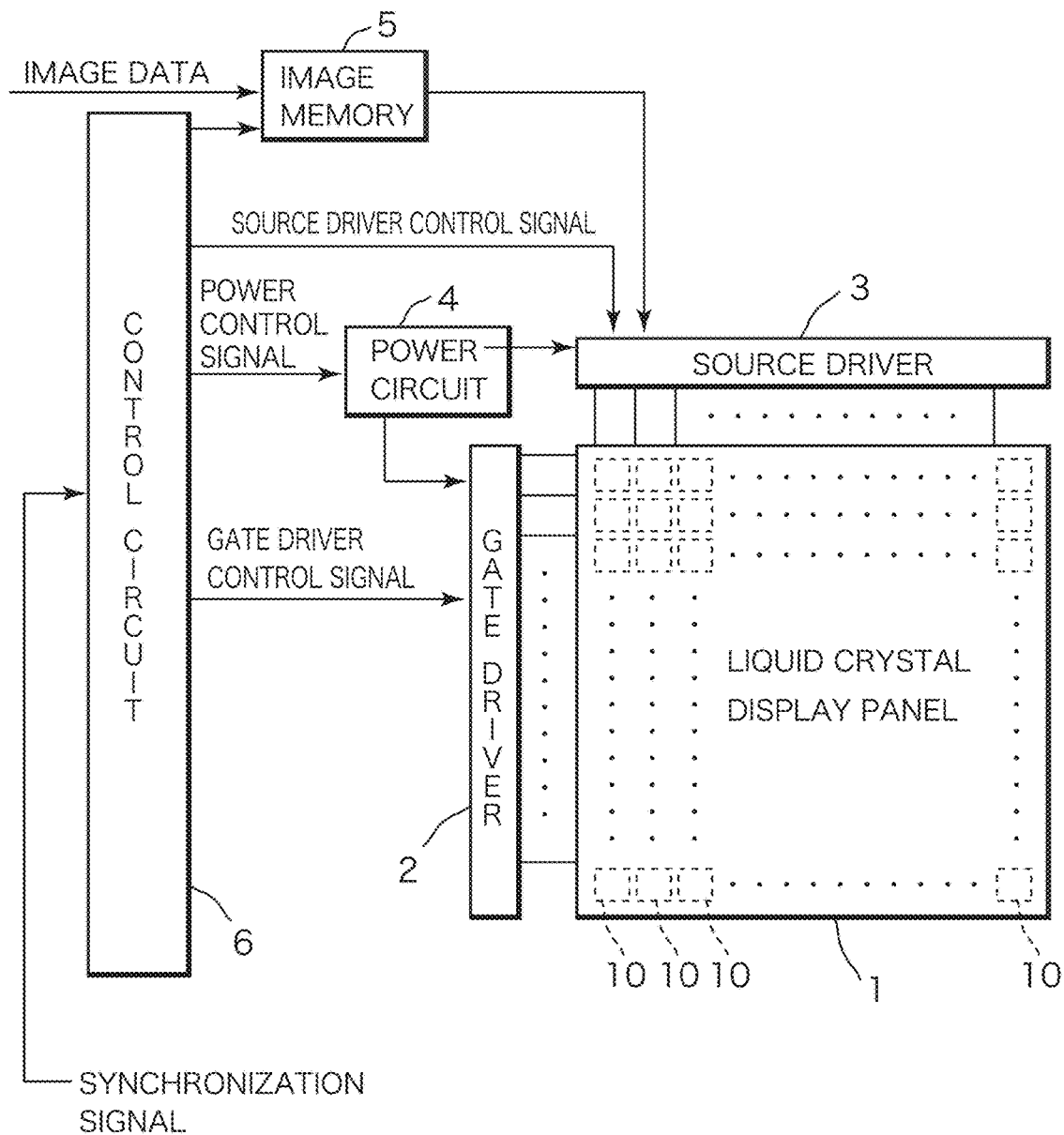
FIG. 7 is a schematic view illustrating a configuration of a driving system of a liquid crystal display apparatus.

Next, a configuration of a liquid crystal display apparatus using the liquid crystal display panel according to the present embodiment will be described. FIG. 7 is a schematic view illustrating a configuration of a driving system of the liquid crystal display apparatus. The display apparatus according to the present embodiment is, for example, a liquid crystal display apparatus including a liquid crystal display panel 1, a gate driver 2, a source driver 3, a power circuit 4, an image memory 5, a control circuit 6 and the like.

The liquid crystal display panel 1 includes a plurality of display elements 10, 10, 10, . . . disposed in a matrix manner. The display elements adjacent to each other are light shielded by the black matrix 151, and each display element 10 is divided by the same, so as to respectively serve as a display pixel.

Figure 10:
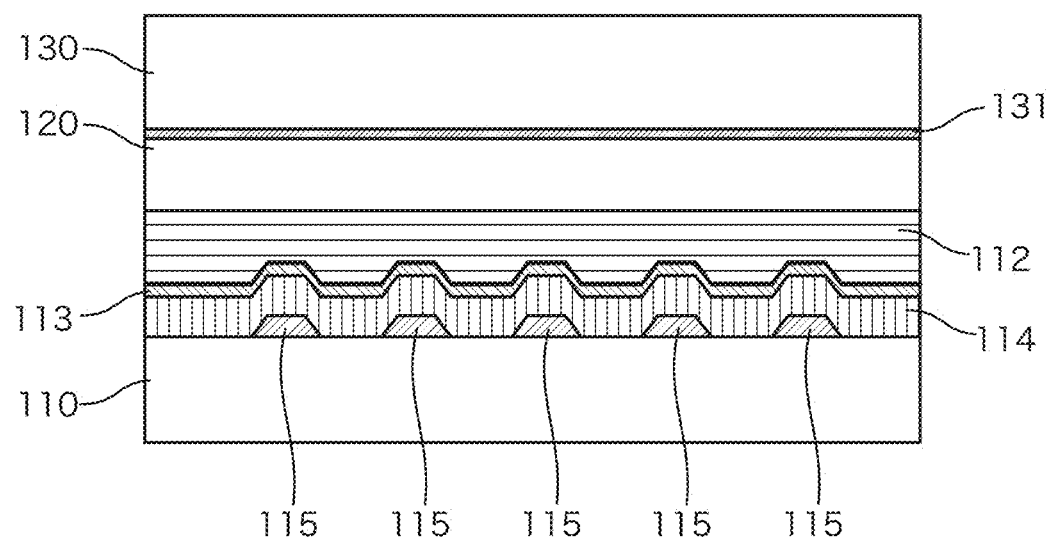
FIG. 10 is a cross-sectional view taken on line X-X in FIG. 9.

Each display element 10 of the liquid crystal display panel 1 includes a pixel electrode provided in the TFT side glass substrate 110, a counter electrode 131 provided in the CF side glass substrate 130, and a liquid crystal layer 120 sealed between the pixel electrode and the counter electrode 131 (see FIG. 10). The control circuit 6 controls the magnitude of a voltage applied to each display element 10 through the gate driver 2 and the source driver 3, so as to control light transmittance of the liquid crystal layer 120 in each display element 10, and determine display luminance in each display pixel.

In order to control the voltage applied to the liquid crystal layer 120 in each display element 10, the control circuit 6 generates a memory control signal, a power control signal, a source driver control signal, and a gate driver control signal based on a synchronization signal input from an outside, and outputs each of the generated control signals to the image memory 5, the power circuit 4, the source driver 3, and the gate driver 2, respectively.

The image memory 5 temporarily stores input display data and outputs pixel data to be displayed on the liquid crystal display panel 1 to the source driver 3, in synchronization with the memory control signal input from the control circuit 6. Furthermore, the image memory 5 may be embedded in the control circuit 6, and may be configured to output image data to the source driver 3 through internal processing of the control circuit 6.

Herein, the input synchronization signal and the display data are included in a signal acquired by A/D converting an LCD signal output from a CPU or an LCD control IC equipped in a mobile phone, a portable game machine, or the like and a CRT output signal of a personal computer (PC), a signal acquired by allowing the control circuit 6 to directly control a video RAM equipped in the PC or the like.

The power circuit 4 generates a driving voltage for the gate driver 2, and a driving voltage for the source driver 3, in synchronization with the power control signal input from the control circuit 6, and outputs the generated driving voltage to the gate driver 2 and the source driver 3, respectively.

The gate driver 2 sequentially outputs a control voltage for controlling the switching element provided in the display element to be turned on/off, in synchronization with the gate driver control signal input from the control circuit 6, to apply it to the gate wiring 21 which is a scanning line.

The source driver 3 receives the pixel data output from the image memory 5, in synchronization with the source driver control signal input from the control circuit 6, and sequentially outputs a signal voltage depending on the pixel data. The signal voltage output from the source driver 3 is supplied to the display element 10 through the source wiring 31 which is the signal line, when the corresponding switching element is turned on.

Embodiment 2.

In the present embodiment, it is possible to relatively increase the amplitude W2 of the meander wiring in the subsequent-stage meander wiring part 54, such that, in particular, the meandering amount in the subsequent-stage meander wiring part 54 may be adjusted, to easily control the wiring length. Therefore, in the prior-stage meander wiring part 52, by increasing the pitch P1 of the meander wiring, a ratio of a region in which the wiring is not formed to an entire region thereof in an in-plane of the TFT side glass substrate 110 may be increased.

Figure 8:
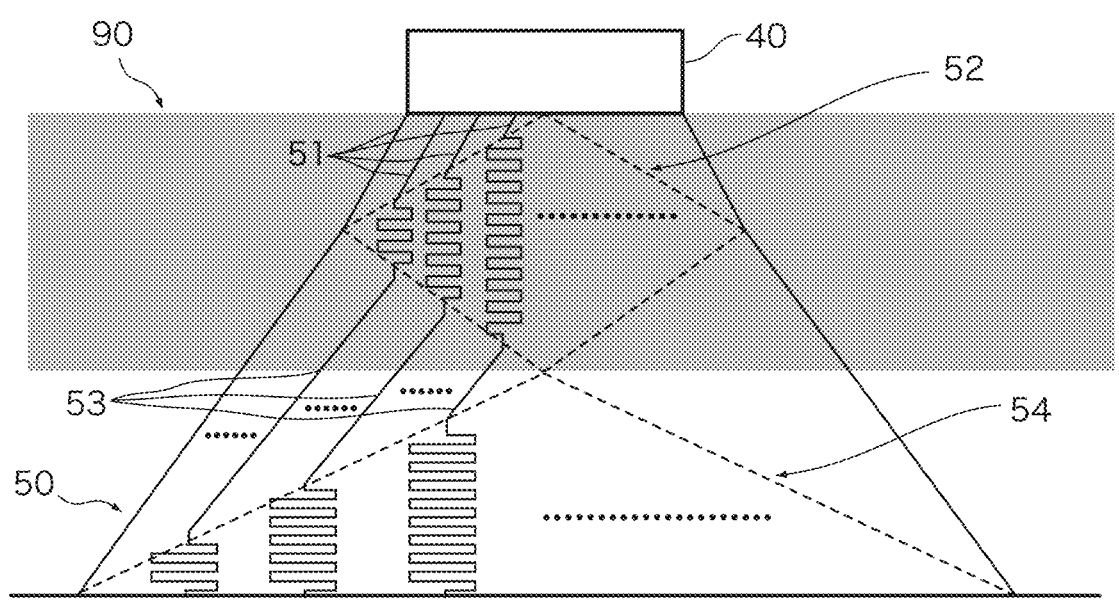
FIG. 8 is a schematic view describing a configuration of the lead-out wiring part.

FIG. 8 is a schematic view describing a configuration of the lead-out wiring part 50. In Embodiment 2, similarly to Embodiment 1, the prior-stage meander wiring part 52 is provided nearer to the signal input part 40, and is connected to the signal input part 40 through the straight lines 51. In addition, the subsequent-stage meander wiring part 54 is provided nearer to the display region, and one end side of the meander wiring part 54 is connected to the prior-stage meander wiring part 52 through the straight lines 53, and the other end side thereof is connected to the signal wirings (the gate wirings 21 or the source wirings 31) disposed within the display region.

As illustrated in FIG. 8, the meander wiring part is provided in the lead-out wiring part 50 by dividing it into the prior-stage meander wiring part 52 and the subsequent-stage meander wiring part 54, such that, the subsequent-stage meander wiring part 54 may be disposed in a relatively wide region. As a result, it is easy to adjust the meandering amount in the subsequent-stage meander wiring part 54, and even in the liquid crystal display panel 1 with a narrow frame, a difference in the resistance value between the lead-out wirings may enter within a predetermined range.

Further, in Embodiment 2, the pitch P1 of the meander wiring in the prior-stage meander wiring part 52 is wider that the pitch P2 of the meander wiring in the subsequent-stage meander wiring part 54, and in a region including the prior-stage meander wiring part 52, a ratio of a region (an opening region) in which the wiring is not formed to an entire region thereof is increased. Therefore, for example, in an aspect in which a seal region 90 is provided in the region including the prior-stage meander wiring part 52, and ultraviolet (UV) rays are exposed from the other surface side of the TFT side glass substrate 110, so as to cure a seal material for sealing the liquid crystal material between the TFT side glass substrate 110 and the CF side glass substrate 130, it is possible to achieve sufficient transmission of the UV rays, and prevent an occurrence of an uncured part in the seal material.

Furthermore, in the example illustrated in FIG. 8, it is configured to provide the seal region 90 in the region which does not include the subsequent-stage meander wiring part 54, but it may be configured so that a part of the seal region 90 is overlapped with the subsequent-stage meander wiring part 54. In this case, the pitch P2 of the meander wiring in the meander wiring part 54 overlapped with the seal region 90 may be increased.

Embodiment 3.

It may be configured that a repair wiring for repairing the disconnection is provided with respect to the meander wiring parts 52 and 54 illustrated in Embodiment 1.

Figure 9:
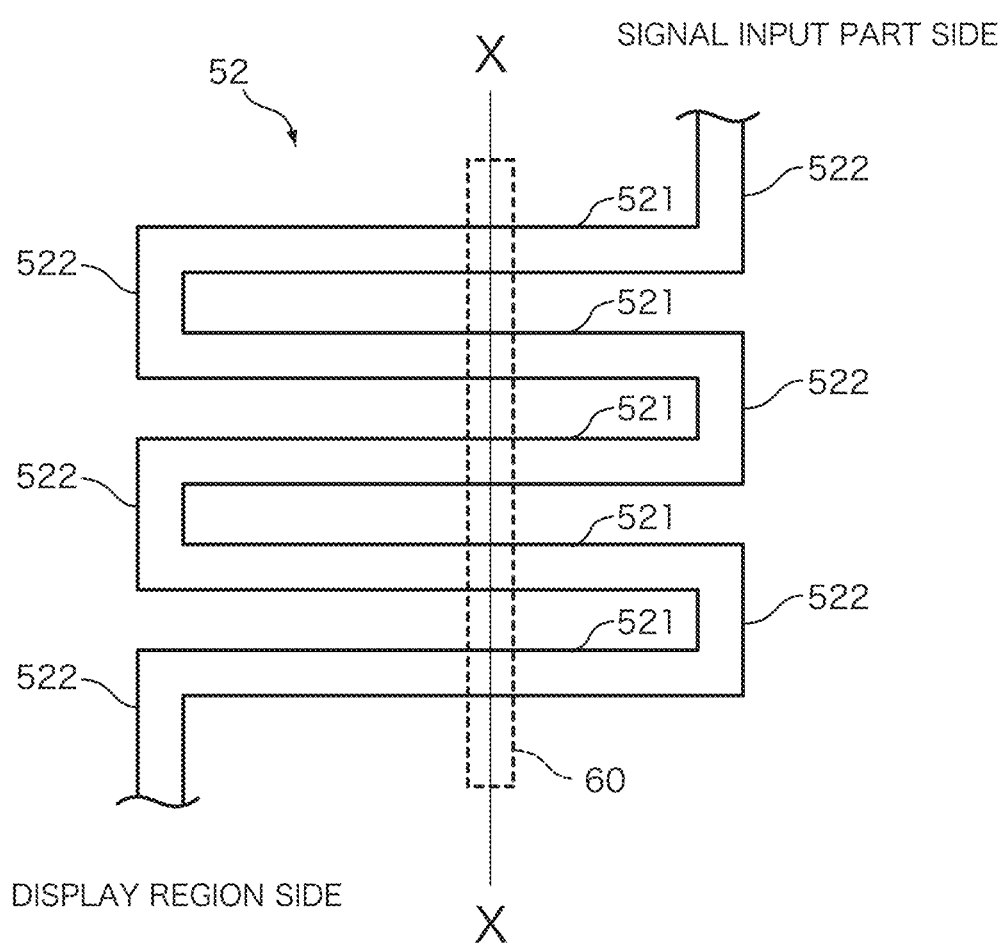
FIG. 9 is a schematic view describing a configuration of a repair wiring in Embodiment 3.

FIG. 9 is a schematic view describing a configuration of a repair wiring 60 in Embodiment 3, and FIG. 10 is a cross-sectional view taken on line X-X in FIG. 9. The repair wiring 60 is disposed so as to intersect the wiring in the meander wiring part 52 at at least two locations, in a plane view. In FIG. 9, a configuration in which the repair wiring 60 is provided with respect to the prior-stage meander wiring part 52, but the repair wiring may also be provided with respect to the subsequent-stage meander wiring part 54 in the exactly same manner.

In the description below, the meander wiring part 52 (lead-out wiring) is connected to the gate wiring 21 (or the source wiring 31).

As illustrated in FIG. 10, the liquid crystal display panel 1 includes the TFT side glass substrate 110 in which each pixel 10 is formed in a matrix manner, a liquid crystal layer 120 formed by sealing the liquid crystal material therein, and the CF side glass substrate 130 in which color filters, and the like are formed. The TFT side glass substrate 110 and the CF side glass substrate 130 are, for example, a glass substrate. Gate wiring layers 115, a gate insulation layer 114, a source wiring layer 113, and a protective layer 112 are laminated on one surface side of the TFT side glass substrate 110. In addition, the counter electrodes 131 are formed on one surface side of the CF side glass substrate 130.

The gate insulation layer 114 covers the gate wiring layers 115 forming the gate wirings 21. The meander wiring part 52 (lead-out wiring) connected to the gate wiring 21 may be, for example, made of the same material as the gate wiring 21 by using the same process as the process of forming the gate wiring 21.

The repair wiring 60 may be formed as a wiring in the source wiring layer 113, and may be made, for example, of the same material (for example, Cu/Ti) as the source wiring 31 by using the same process as the process of forming the source wiring 31. That is, the source wiring layer 113 including the repair wiring 60 and the gate wiring layers 115 including the wiring of the meander wiring part 52 to be repaired are laminated with the gate insulation layer 114 interposed therebetween.

Figure 11:
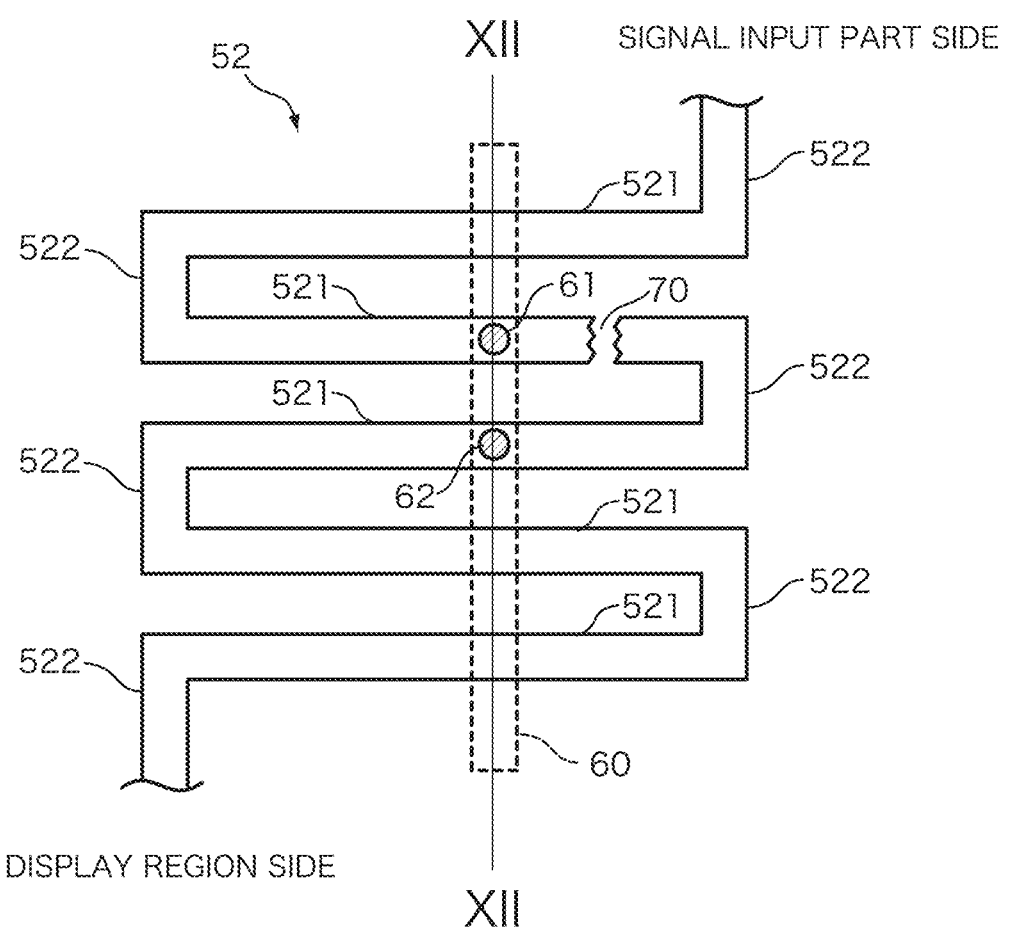
FIG. 11 is a schematic view describing a method for repairing a disconnection.
Figure 12:
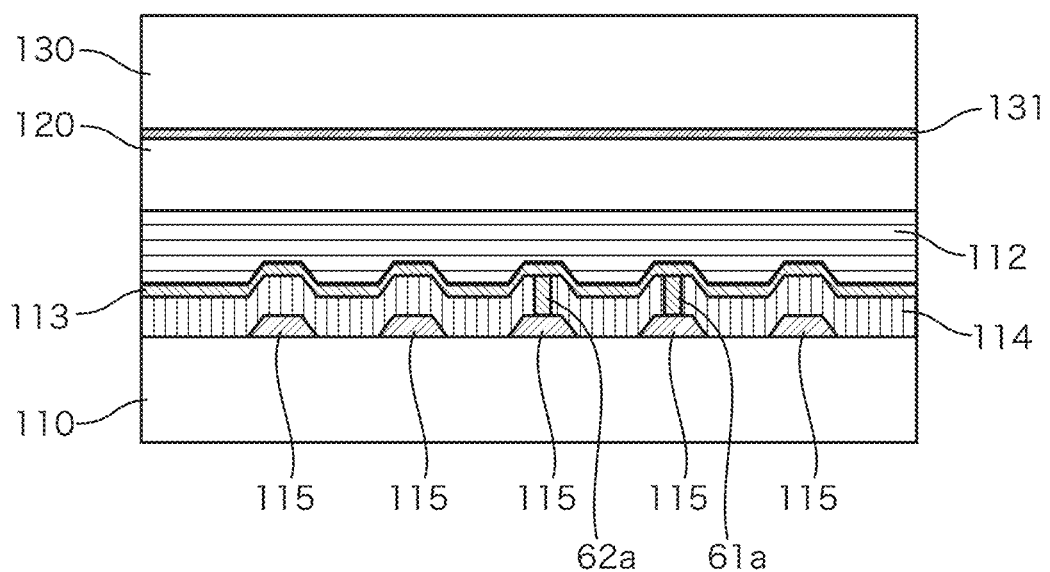
FIG. 12 is a cross-sectional view taken on line XII-XII in FIG. 11.

FIG. 11 is a schematic view describing a method for repairing a disconnection, and FIG. 12 is a cross-sectional view taken on line XII-XII in FIG. 11. Hereinafter, a case in which a disconnection location 70 occurs at one location on the wiring in the meander wiring part 52 will be described. The example illustrated in FIG. 11 depicts a state in which the disconnection location 70 occurs at a second cross wiring 521 from the signal input part 40 side. In this case, a cross part 61 between a second cross wiring 521 from the signal input part 40 side and the repair wiring 60, and an cross part 62 between a third cross wiring 521 from the signal input part 40 side and the repair wiring 60 are molten-rectified, and thereby it is possible to provide a bypass path between the second cross wiring 521 and the third cross wiring 521.

Specifically, when the disconnection location 70 occurs at the second cross wiring 521 from the signal input part 40 side, while viewing the cross part 61 between the second cross wiring 521 from the signal input part 40 side and the repair wiring 60 by using a camera and the like, the other surface side of the TFT side glass substrate 110 is irradiated with a laser beam toward the cross part 61, and a part of the repair wiring 60 becomes molten, and thereby a conduction part 61a, in which the repair wiring 60 and the cross wiring 521 located in a lower layer thereof are mutually conducted at the cross part 61, is formed. By the same manner, while viewing the cross part 62 between the third cross wiring 521 from the signal input part 40 side and the repair wiring 60, the other surface side of the TFT side glass substrate 110 is irradiated with a laser beam toward the cross part 62, and a part of the repair wiring 60 becomes molten, and thereby a conduction part 62a, in which the repair wiring 60 and the cross wiring 521 located in the lower layer thereof are mutually conducted at the cross part 62, is formed. Thereby, a bypass path passing through the two cross parts 61 and 62 and the repair wiring 60 may be formed, to repair the disconnection.

As described above, in the present embodiment, the repair wiring 60 intersecting the wiring (lead-out wiring) of the meander wiring part 52 to be repaired at at least two locations is provided, such that the two cross parts 61 and 62 between the lead-out wiring and the repair wiring 60 may be easily viewed, and a repair efficiency may be improved.

Further, in the present embodiment, even when a position in which the repair wiring 60 is formed is slightly shifted in an in-plane direction, the cross parts (such as the two cross parts 61 and 62) between the repair wiring 60 and the lead-out wiring are reliably formed without decreasing an overlapped amount of the repair wiring 60 with the lead-out wiring, such that a molten-rectifying is performed using these cross parts (such as the two cross parts 61 and 62), and thereby it is possible to repair the disconnection.

In Embodiments 1 to 3, a configuration of providing two meander wiring parts 52 and 54 has been described, but it may be configured to provide three or more meander wiring parts with respect to one lead-out wiring. In this case, in one or a plurality of meander wiring part other than the meander wiring part 52 nearest to the signal input part 40, the amplitude of the meander wiring may be increased.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims In addition, technical features described in each embodiment may be combined with each other, and new technical features may be formed by the combination.

It is noted that, as used herein and in the appended claims, the singular forms "a", "an", and "the" include plural referents unless the context clearly dictates otherwise.

The invention claimed is:

1. A display panel comprising:
    a plurality of display elements disposed in a matrix manner;
    signal input parts to which signals to be supplied to the plurality of display elements are input; and
    a plurality of signal wirings which connect the plurality of display elements and the signal input parts, wherein the plurality of signal wirings include one or more lead-out wiring parts in which a wiring interval nearer the signal input parts and a wiring interval nearer the plurality of display elements are different from each other, and at least one signal wiring of the plurality of signal wirings in one of the one or more lead-out wiring parts is provided with a plurality of meander wiring parts whose wirings are meandered; wherein
    the one signal wiring includes a first meander wiring part nearer the signal input parts, and a second meander wiring part provided between the first meander wiring part and the plurality of display elements, and one end of a meander wiring in the second meander wiring part is connected to a meander wiring in the first meander wiring part through a straight wiring,
    the meander wiring in the second meander wiring part has a larger amplitude than the meander wiring in the first meander wiring part, and
    the amplitude of the meander wiring in the second meander wiring part is determined by matching with a wide wiring interval in the one or more lead-out wiring parts, and a pitch of the meander wiring in the first meander wiring part is wider than a pitch of the meander wiring in the second meander wiring part.

2. The display panel according to claim 1, wherein the plurality of meander wiring parts are provided so that a difference in a resistance value between the plurality of signal wirings becomes a value within a predetermined range.

3. The display panel according to claim 1, further including a repair wiring which is disposed so as to intersect a meander wiring in one of the plurality of meander wiring parts at at least two locations, and an insulation layer which is provided between the meander wiring in the one of the plurality of meander wiring parts and the repair wiring.

4. A display apparatus comprising:
the display panel according to claim 1; and
a driving unit configured to drive the plurality of display elements included in the display panel.

5. The display apparatus according to claim 4, wherein the plurality of meander wiring parts are provided so that a difference in a resistance value between the plurality of signal wirings becomes a value within a predetermined range.

6. The display apparatus according to claim 4, further including a repair wiring which is disposed so as to intersect a meander wiring in one of the plurality of meander wiring parts at least at two locations, and an insulation layer which is provided between the meander wiring in the one of the plurality of meander wiring parts and the repair wiring.

7. The display apparatus according to claim 4, wherein
the display panel is a liquid crystal display panel including a first transparent substrate which is provided with the plurality of signal wirings, a second transparent substrate and a liquid crystal which is sealed between the first transparent substrate and the second transparent substrate by a seal material, and
the seal material is provided in a seal region including the first meander wiring part.

8. The display panel according to claim 1, wherein
the display panel is a liquid crystal display panel including a first transparent substrate which is provided with the plurality of signal wirings, a second transparent substrate and a liquid crystal which is sealed between the first transparent substrate and the second transparent substrate by a seal material, and
the seal material is provided in a seal region including the first meander wiring part.

* * * * *